United States Patent
Suzuki et al.

(10) Patent No.: US 6,538,329 B2
(45) Date of Patent: Mar. 25, 2003

(54) SEMICONDUCTOR INTEGRATED CIRCUIT DEVICE AND METHOD FOR MAKING THE SAME

(75) Inventors: Masayuki Suzuki, Kokubunji (JP); Shinji Nishihara, Koganei (JP); Masashi Sahara, Kodaira (JP); Shinichi Ishida, Higashimurayama (JP); Hiromi Abe, Tokyo (JP); Sonoko Tohda, Higashimurayama (JP); Hiroyuki Uchiyama, Higashimurayama (JP); Hideaki Tsugane, Fussa (JP); Yoshiaki Yoshiura, Ushiku (JP)

(73) Assignees: Hitachi, Ltd., Tokyo (JP); Hitachi ULSI Engineering Corp., Kodaira (JP); Hitachi Microcomputer System Ltd., Kodaira (JP)

( * ) Notice: Subject to any disclaimer, the term of this patent is extended or adjusted under 35 U.S.C. 154(b) by 0 days.

(21) Appl. No.: 09/933,163

(22) Filed: Aug. 21, 2001

(65) Prior Publication Data

US 2002/0019124 A1 Feb. 14, 2002

Related U.S. Application Data

(62) Division of application No. 09/245,743, filed on Feb. 8, 1999, now Pat. No. 6,300,237, which is a division of application No. 08/584,065, filed on Jan. 11, 1996, now Pat. No. 5,904,556.

(30) Foreign Application Priority Data

Jan. 11, 1995 (JP) ................................................. 7-2551

(51) Int. Cl.$^7$ .......................... H01L 23/48; H01L 23/52; H01L 29/40

(52) U.S. Cl. ....................................................... 257/765

(58) Field of Search ............................. 257/763, 765, 257/771, 773, 784, 757, 753, 751, 737, 734, 690

(56) References Cited

U.S. PATENT DOCUMENTS

| 4,017,886 A | 4/1977 | Tomono et al. ............. 438/623 |
| 4,782,380 A | 11/1988 | Shankar et al. ................ 357/71 |
| 4,970,176 A | 11/1990 | Tracy et al. ................ 437/187 |

(List continued on next page.)

FOREIGN PATENT DOCUMENTS

| JP | 4-296041 | 10/1992 |
| JP | 4-363024 | 12/1992 |
| JP | 5-47762 | 2/1993 |

(List continued on next page.)

OTHER PUBLICATIONS

An Advanced Multilevel Interconnection Technology For 0.35 Micron High Performance Devices (1994) pp. 36–43.
Talieh, et al., Novel Method for Aluminum Planarization for Submicron High Aspect Ratio Contacts, Jun. 8, 1993 VMIC conference, pp. 211–213.

Primary Examiner—William David Coleman
(74) Attorney, Agent, or Firm—Antonelli, Terry, Stout & Kraus, LLP

(57) ABSTRACT

A method for making a semiconductor integrated circuit device comprises the steps of: (a) depositing a first underlying film made of titanium nitride, on an insulating film having a plurality of through-holes; (b) depositing a tungsten film on the first underlying film, and etching the tungsten film back by means of a fluorine-containing plasma thereby leaving the tungsten film only in the connection holes; (c) sputter etching the surface of the first underlying film to remove the fluorine from the surface of the first underlying film; and (d) forming an aluminum film on the first underlying film. The semiconductor integrated circuit device obtained by the method is also described.

6 Claims, 13 Drawing Sheets

U.S. PATENT DOCUMENTS

| | | | |
|---|---|---|---|
| 4,994,410 A | 2/1991 | Sun et al. | 437/192 |
| 5,143,865 A | 9/1992 | Hideshima et al. | 438/614 |
| 5,306,952 A * | 4/1994 | Matsuura et al. | 257/165 |
| 5,356,836 A * | 10/1994 | Chen et al. | 204/192.17 |
| 5,407,861 A | 4/1995 | Marangon et al. | 438/672 |
| 5,407,863 A | 4/1995 | Katsura et al. | |
| 5,420,070 A | 5/1995 | Matsuura et al. | 437/190 |
| 5,529,955 A | 6/1996 | Hibino et al. | 438/626 |
| 5,565,378 A * | 10/1996 | Harada et al. | 228/180.5 |
| 5,567,647 A | 10/1996 | Takahashi | 437/177 |
| 5,614,765 A | 3/1997 | Avanzino et al. | 257/774 |
| 5,635,763 A | 6/1997 | Inoue et al. | 257/763 |
| 5,804,505 A | 9/1998 | Yamada et al. | |
| 5,904,556 A | 5/1999 | Suzuki | 438/623 |
| 6,271,137 B1 * | 8/2001 | Liou et al. | 438/646 |

FOREIGN PATENT DOCUMENTS

| | | |
|---|---|---|
| JP | 5-86466 | 4/1993 |
| JP | 5-275370 | 10/1993 |
| JP | 6-140372 | 5/1994 |
| JP | 7-297189 | 11/1995 |

* cited by examiner

SEMICONDUCTOR INTEGRATED CIRCUIT DEVICE AND METHOD FOR MAKING THE SAME

This application is a Divisional application of Ser. No. 09/245,743, filed Feb. 8, 1999, now U.S. Pat. No. 6,300,237, which is a Divisional application of Ser. No. 08/584,065, filed Jan. 11, 1996, now U.S. Pat. No. 5,904,556.

BACKGROUND OF THE INVENTION

This invention relates to a semiconductor integrated circuit device and also to a method for making the device. More particularly, the invention relates to a technique which is effective when applied to an interconnection structure and an interconnecting process of LSI having multiplayer interconnections.

In recent years, integration of LSI has been in progress. This leads to increased aspect ratios (i.e., the depth of a connection hole formed on an inter-layer insulating film between a given Al interconnection and a low conductor layer, semiconductor region or a lower Al interconnection. In order to prevent the breakage of the Al interconnections in the inside of the connection holes, a so-called tungsten plug technique has been utilized wherein a W (tungsten) film is filled in the connection holes.

To fill the W film up in the connection hole, a W film is deposited, according to the CVD method, on the entire surface of an insulating film in which connection holes have been formed. Subsequently, the W film on the insulating film is etched back, thereby leaving the W film only in the connection holes. For the etching back of the W film, a F (fluorine) plasma is used. In order to prevent the underlying insulating film (silicon oxide film) from being etched out with the F plasma, a underlying layer, which is constituted of stacked films including a Ti film and a TiN film, has been formed beneath the W film.

The underlying film constituted of the Ti/TiN stacked films is very resistant to electromigration or stress migration, and has been employed for interconnection of LSI which is fabricated according to the design rule on the order of submicrons.
Interconnections having such a stacked structure as of Ti/TiN/Al—Cu/TiN formed in this order and tungsten plug techniques for this are set out, for example,. in LVSI Multi-level Conference Jun. 7–8, 1994, pp. 36–43.

SUMMARY OF THE INVENTION

The semiconductor integrated circuit device to which the invention is directed is of the type which comprises three-layered metallic interconnections including a first layer made of a tungsten film, and second and third layers made of an aluminium alloy film, respectively.

A titanium (Ti) film and a titanium nitride (TiN) film, both serving as a underlying layer, are provided beneath the first-layered tungsten film. The interconnection for the first layer is constituted of a three-layered structure made of Ti/TiN/W formed In this order.

Likewise, a titanium (Ti) underlying film, a titanium nitride (TiN) underlying film and a titanium (Ti) underlying film are provided beneath each of the second and third-layered aluminium alloy (Al—Si—Cu) layers. Ti/TiN cap films are provided on each of the second and third-layered aluminum alloy (Al—Si—Cu) layers. More particularly, a six-layered structure of Ti/TiN/Ti/Al—Si—Cu/Ti/TiN as viewed from the bottom is established. As a matter of course, a tungsten (W) film is filled in connection holes connecting the first and second layers and the second and third layers therewith. Each tungsten film exists in the connection hole between the titanium nitride (TiN) underlying film and the titanium (Ti) underlying film formed on the TiN film.

We found that the semiconductor integrated circuit having such an interconnection structure as set out above has the following problems.

(1) The process of filling the tungsten (W) film in the connection holes essentially requires removal of the W film from the insulating film through etching-back by use of a fluorine (F) plasma as set out hereinbefore. This permits part of the fluorine in the plasma to be left on the surface of the underlying film (Ti/TiN stacked film) formed on the insulating film and exposed by the etching-back step. The thus left fluorine reacts with titanium to provide a solid compound. Hence, the compound is left on the underlying film. When another underlying film (Ti film) is formed on the first-mentioned underlying film, or when an aluminium alloy film is deposited subsequently to the etching-back step, the bonding force at the interface between the underlying film on which the compound has remained and the film formed on this underlying film lowers by the influence of the fluorine (F) residue.

Especially, the uppermost interconnection layer partly serves as a bonding pad. When a wire is bonded to the bonding pad, the pad may separate owing to the impact of the bonding. More particularly, it has been found that the underlying film on which the compound has been left separates from another underlying film formed thereon at the bonding pad portion.

(2) The process of filling the W film in the connection holes includes the etching-back step wherein the W film is allowed to be left only in the connection holes. This requires over-etching in order to completely remove the W film from the surface of the insulating film. At the time, the W film in the connection holes is also etched out from the outer surface thereof. This leaves a step between the surface of the insulating film or the surface of the underlying film and the surface of the W film in each connection hole.

In this condition, when an Al interconnection is formed on the insulating film, the Al interconnection is stepped at a surface portion just above the connection hole owing to the above-mentioned step. If a second connection hole is formed in the interlayer insulating film just above the first-mentioned connection hole in order to connect the Al interconnection and the upper Al interconnection therewith and the second connection hole is filled up with the W film, an insulating martial made of $AlF_3$ is formed in the second connection hole at the time of the formation of the W film. This presents the problem that the conduction failure takes place between the Al interconnection and the upper Al interconnection.

Owing to the step appearing at the surface of the Al interconnection, the upper layer film formed on the Al interconnection suffers a coverage failure, thus Al being partially exposed from the upper layer film. The thus exposed Al reacts with F left at the time of the formation of the W film, thereby forming an insulating $AlF_3$ film. This is the reason why there arises the problem that the conduction failure or an increase in contact resistance between the Al interconnection and the upper Al interconnection takes place.

(3) As having set out hereinabove, the Al interconnection is constituted of multi-layered interconnection (Ti/TiN/Ti/Al—Si—Cu/Ti/TiN). Usually, an uppermost interconnection is used as a bonding pad. However, if the uppermost interconnection is constituted of this type of multi-layered interconnection and part of a passivation film covering the uppermost interconnection therewith is removed by etching to form a bonding pad, a compound formed by reaction between Al and Ti is deposited at the interface between the Al film and the upper film (Ti/TiN stacked film) formed on the Al film. This compound is so hard that the bonding force between the bonding pad and a wire lowers. It should be noted that the etching of the passivation film does not make it possible to fully remove the compound of Al and Ti.

(4) The Al interconnections are formed by depositing the Al composite film by sputtering and dry etching the deposited film. If the coverage of the Al film on deposition of the Al composite film lowers by the influence of the step formed in the underlying layer, the processing accuracy of the interconnection through dry etching unfavorably lowers. To avoid this, a so-called high temperature Al sputtering technique has been proposed. In the technique, a semiconductor substrate is maintained at high temperatures, and the Al film is deposited while re-flowing the Al film by application of heat from the substrate, thereby ensuring a good coverage of the Al.

In this connection, however, when an Al film, particularly an Al—Si—Cu film or an Al—Cu film, is deposited according to the high temperature sputtering method, a reaction product is also precipitated in the film. The reaction product is left after dry etching, thus creating another cause of lowering the processing accuracy of the Al interconnection.

It is therefore an object of the invention to provide a technique whereby a bonding pad constituted of multi-layered interconnection is prevented from separation.

It is another object of the invention to provide a technique whereby an bonding force between a bonding pad constituted of multi-layered interconnection and a wire is improved.

It is a further object of the invention to provide a technique which is able to realize a stack-on-plug structure wherein connection holes for an upper layer are located just above connection holes of an interlayer insulating film, respectively.

It is a still further object of the invention to provide a technique wherein when an Al film is deposited according to a high temperature sputtering method, any reaction product is prevented from formation as precipitated in the Al film.

These and other objects and novel features of the invention will become apparent from the following description and the accompanying drawings.

Typical embodiments of the invention are summarized below.

According to one embodiment of the invention, there is provided a method for making a semiconductor integrated circuit device which comprises the steps of:

(a) forming a first insulating film formed on a semiconductor substrate and having a plurality of through-holes;

(b) forming a first underlying film on the first insulating film and in the plurality of through-holes and forming a tungsten film on the underlying film in such a thickness that the through-holes are filled therewith;

(c) etching the tungsten film to remove the tungsten film from said first insulating film thereby exposing the surface of the first underlying film and selectively leaving the tungsten film in the through-holes;

(d) sputter etching the surface of the first underlying film;

(e) forming a first metallic film on the sputter-etched first underlying film; and (f) electrically connecting a metallic wire to the first metallic film in regions other than regions where the through-holes are formed.

According to another embodiment of the invention, there is also provided a semiconductor integrated circuit device which comprises:

(a) a semiconductor substrate;

(b) a first interconnection film formed on the semiconductor substrate;

(c) an insulating film formed on the first interconnection film and having a plurality of through-holes;

(d) a second interconnection film connected with the first interconnection film through the through-holes and formed on the insulating film; and (e) a bonding wire connected to the second interconnection film, wherein the first interconnection film is constituted of a first aluminium alloy film, a titanium film formed on the first aluminium film, and a first titanium nitride formed on the titanium film, and the second interconnection film is constituted of a second aluminium alloy film and a second titanium nitride film formed on the second aluminium alloy film.

According to a further embodiment of the invention, there is provided a method for making a semiconductor integrated circuit device, which method comprising forming an aluminium film on a main surface of a semiconductor substrate by sputtering, characterized in that a first aluminium film is formed on the semiconductor substrate which is kept at a relatively low temperature, and a second aluminium film is formed at a substrate temperature which is higher than the first-mentioned temperature According to a still further embodiment of the invention, there is provided a method for making a semiconductor integrated circuit device, which comprises the steps of:

(a) forming a first insulating film formed on a semiconductor substrate and having a plurality of first through-holes;

(b) forming a tungsten film formed on the first insulating film and in the first through-holes in such a thickness that the first through-holes are filled with the tungsten film;

(c) etching the tungsten film to remove it from the first insulating film until the surface of the first insulating film is exposed while selectively leaving the tungsten film in the individual first through-holes;

(d) forming a first aluminium film on the exposed surface of the first insulating film and on the tungsten film in the first through-holes; and (e) re-flowing the first aluminium film at a given temperature.

DESCRIPTION OF THE PREFERRED EMBODIMENTS

Figure 1:
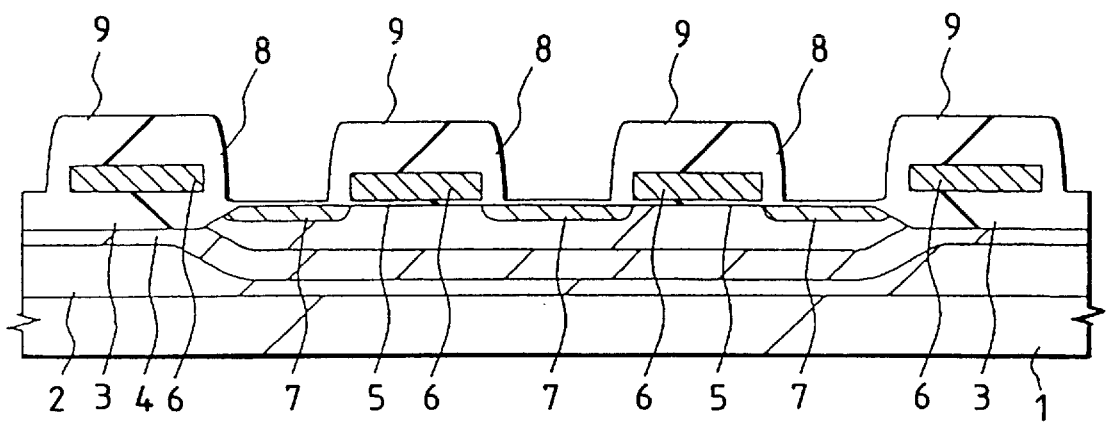
FIGS. 1 to 11 and 15 to 17 are, respectively, a sectional view of an essential part of a semiconductor substrate which illustrates a method for making a semiconductor integrated circuit device according to one embodiment of the invention.

Embodiments of the invention are described in detail with reference to the accompanying drawings, in which like reference numerals indicate like parts or members throughout the specification.

Reference is now made to FIGS. 1 to 17 which illustrate an embodiment of the invention applied to MOS-LSI having a three-layered interconnection structure.

Initially, as shown in FIG. 1, a semiconductor substrate 1 made of p-type single crystal silicon is ion-implanted with a p-type impurity (boron) on the main surface thereof to form a p-type well 2. Thereafter, a field oxide film 3 is formed on the main surface of the p-type well according to a selective oxidation (LOCOS) method. Subsequently, a gate oxide 5 is formed on the main surface of the p-type well 2 surrounded with the field oxide film 3 according to a thermal oxidation method, followed by ion implantation of a p-type impurity (boron) into the p-type well 2, thereby creating a p-type channel stopper layer 4 in the p-type well 2 including the lower portion of the field oxide film 3.

Next, a polysilicon film and a silicon oxide film 9 are successively deposited on the semiconductor substrate 1 according to a CVD method, followed by patterning of this two-layered film by drying etching through a photoresist mask to form gate electrodes 6 of MISFET made of the polysilicon film. The polysilicon forming each gate electrode 6 is introduced with an n-type impurity (e.g. P) in order to reduce the resistance thereof. It will be noted that the gate electrodes 6 may be constituted of a polyside film which is made of a refractory metal silicide film, such as WSix, MoSix, TiSix or TaSix, built on the top of the polysilicon film.

An n-type impurity (e.g. P) is ion-implanted into the p-type well 2 in self-aligned with the gate electrodes 6 so that a pair of n-type semiconductor regions 7, 7, which constitute source and drain regions of the MISFET, are formed in the p-type well 2 at opposite sides of each gate electrode 6.

Thereafter, a silicon oxide film is deposited over the semiconductor substrate 1 by a CVD method, followed by anisotropic etching of the silicon oxide film by a reactive ion etching (RIE) method to form side wall spacers 8 at side walls of the gate electrode 6 respectively.

Figure 2:
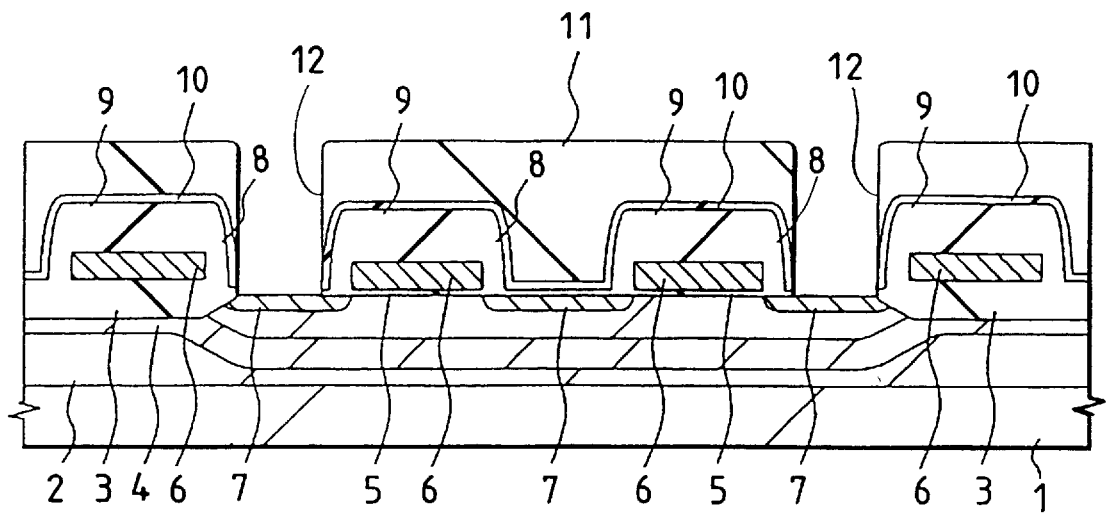

Then, as shown in FIG. 2, an oxide film 10 and a BPSG film 11 are successively formed over the semiconductor substrate 1 by a CVD method, followed by dry etching the BPSG film 11 and the silicon oxide film 10 through a photoresist mask, thereby forming a connection hole 12 arriving at one of the paired semiconductor regions 7, 7 of the MISFET.

Figure 3:
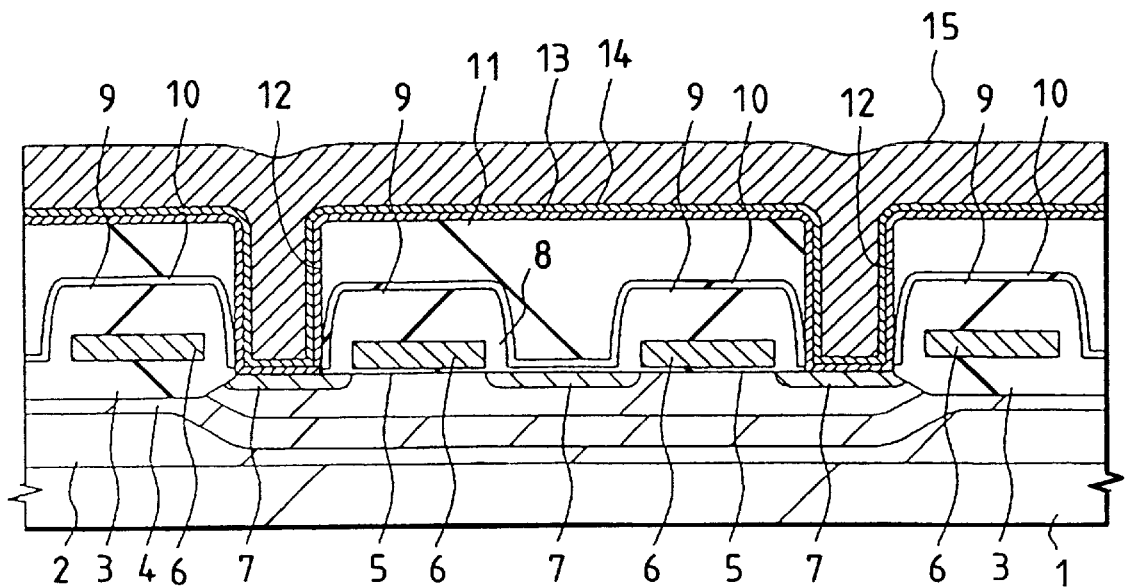
Figure 4:
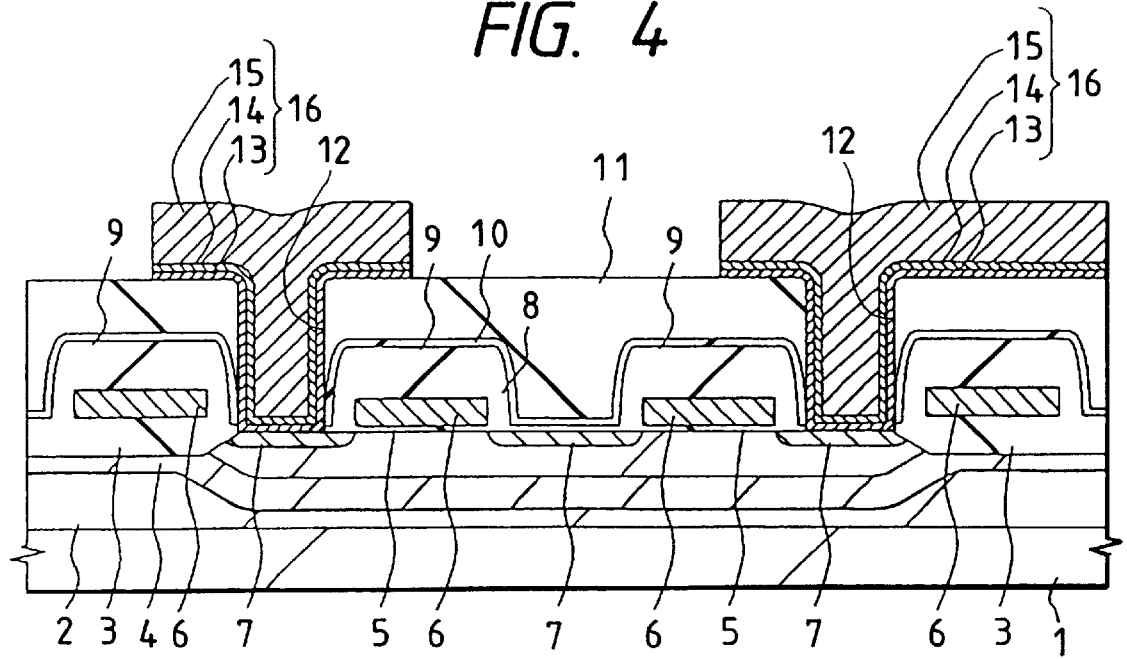

As shown in FIG. 3, an underlying film comprising a first underlying Ti film 13 (30 nm in thickness) and a second underlying TiN film 14 (70 nm in thickness) is deposited on the BPSG film 11 including the inner surfaces of the connection hole 12 according to a sputtering method, followed by further deposition of a W film 15 (250 nm in thickness) on the TiN film 14 by a CVD method. Subsequently, as shown in FIG. 4, the W film 15 and the underlying film-(consisting of the TiN film 14 and the Ti film 13) are subjected to patterning through a photoresist mask, thereby forming a tungsten (W) interconnection 16 which is a first interconnection layer.

The first underlying titanium (Ti) film 13 is provided for the following reason: the film 13 is in contact with the n-type and p-type semiconductor regions (not shown) formed on the main surface of the semiconductor substrate 1 to form titanium silicide (TiSi); and hence the contact resistance can be reduced.

On the other hand, the second underlying titanium nitride (TiN) film 14 is provided in order to prevent the reaction between the gas (WF$_6$) used to form the tungsten film (W) 15 and the titanium film 13.

Figure 5:
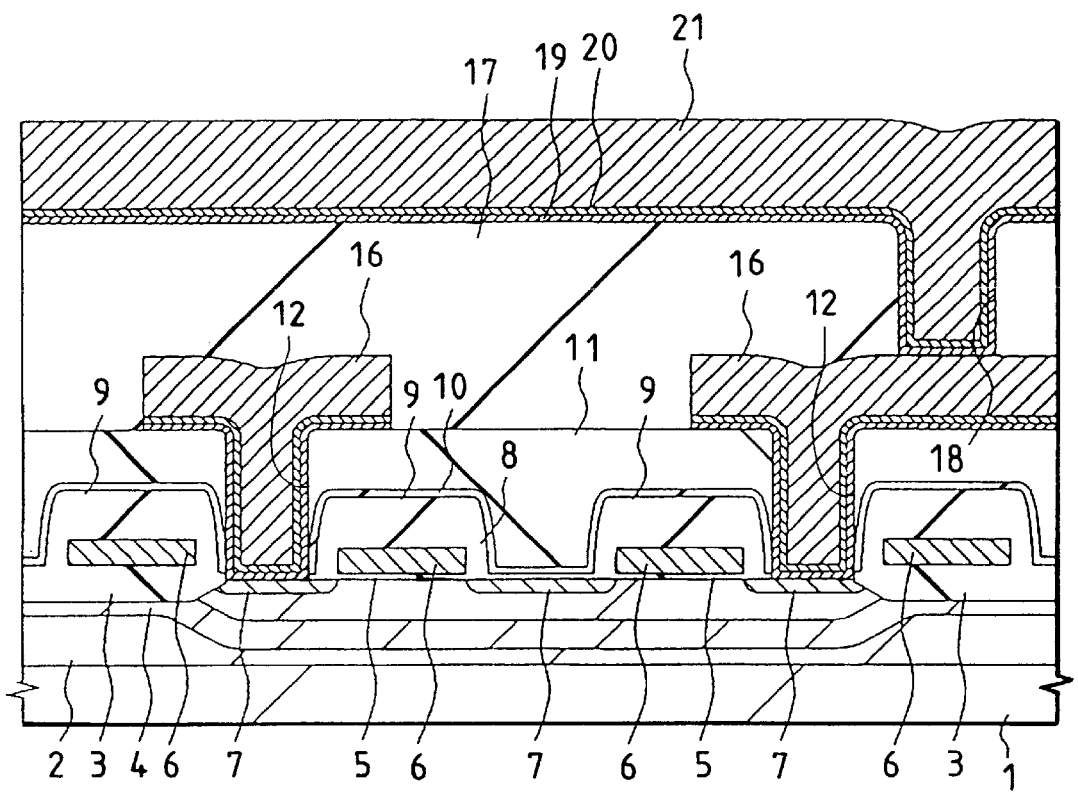

As shown in FIG. 5, a first interlayer insulating film 17 is deposited on the top of the W interconnection 16. The interlayer insulating film 17 is constituted, for example, of a three-layer film made of a silicon oxide film deposited by a CVD method, a spin-on-glass film deposited by spin coating, and a silicon oxide film deposited by the CVD method.

Next, a connection hole 18 is formed in the insulating film 17 on the W interconnection 16 by dry etching using a photoresist as a mask, followed by deposition, on the interlayer insulating film 17 including the inner surfaces of the connection hole 18, of an underlying film consisting of a titanium (Ti) film 19 (30 nm in thickness), a titanium nitride (TiN) film 20 (100 nm in thickness) according to a sputtering method. Thereafter, a tungsten (W) film 21 (500 nm in thickness) is formed on the titanium nitride (TiN) film 20 by the CVD method.

It will be noted that the underlying titanium (Ti) film 19 is provided so that it properly controls the crystal orientation of an aluminium alloy film to be subsequently formed, thereby imparting a high electromigration resistance thereto. Likewise, the underlying titanium nitride (TiN) film 20 is provided in order to prevent the reaction between the gas (WF$_6$) used to form the tungsten (W) film 21 and the titanium (Ti) film 19, like the afore-stated titanium nitride (TiN) film 14.

Figure 6:
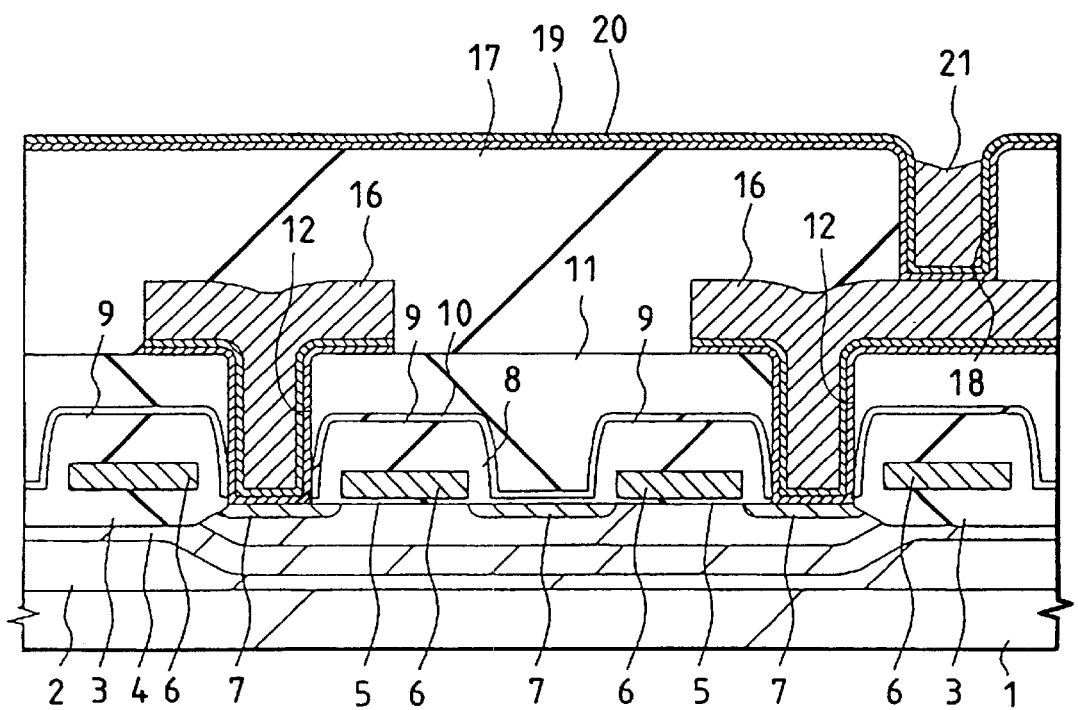

As shown in FIG. 6, the tungsten (W) film 21 is etched back by use of a fluorine (F) plasma (e.g. SF$_6$ gas) to remove the tungsten (W) film 21 from the interlayer insulating film 17 but to leave the tungsten (W) film 21 only in the connection holes 18. In order to completely remove the tungsten (W) film 21 from the interlayer insulating film 17, the tungsten (W) film 21 has to be over-etched. This permits the tungsten (W) film 21 in each connection hole 18 to be removed to a degree, thereby establishing a step with the surface of the interlayer insulating film 17 or the underlying titanium nitride film 20. The underlying film, particularly the TiN film 20, formed on the interlayer insulating film 17 serves as an etching stopper at the time of the etching-back.

Figure 7:
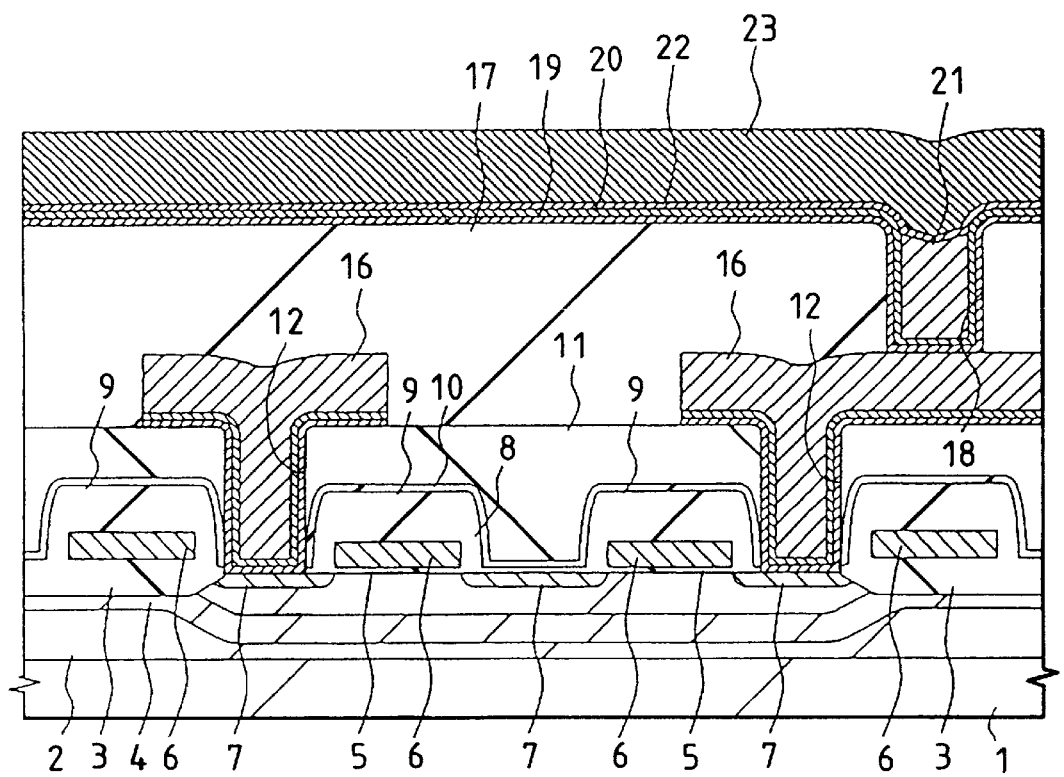

Then, as shown in FIG. 7, a titanium (Ti) film 22 (10 nm in thickness) and an Al—Si—Cu film 23 (400 nm in thickness) are successively deposited, by a sputtering method, on the titanium nitride (TiN) film 20 exposed at the surface thereof on the interlayer insulating film 17. At the time, the aluminium alloy (Al—Si—Cu) film 23 has a stepped surface at position just above the connection hole 18 formed in the insulating film 17, correspondingly stepped between the surfaces of the interlayer insulating film 17 and the W film 21 in the connection hole 18.

Figure 8:
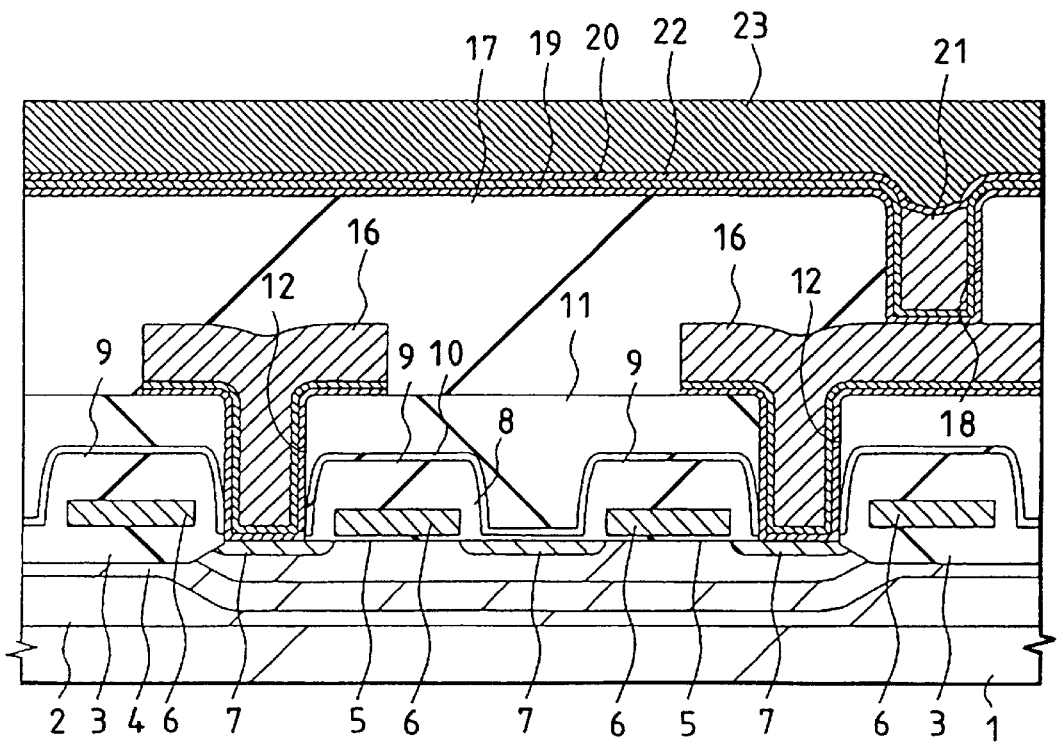

To avoid this, according to this embodiment, the semiconductor substrate 1 is heated after deposition of the aluminium alloy (Al—Si—Cu) film 23 as is particularly shown in FIG. 8, so that the aluminium alloy (Al—Si—Cu) film 23 is re-flown thereby permitting the surface to be flattened. The re-flowing conditions include a substrate temperature of 450° C., a pressure of 1 mTorr, and a heating time of 180 seconds. The re-flown aluminium (Al—Si—Cu) film 23 has a surface reflectivity of 91% (wavelength: 365 nm) and is thus very flat.

Figure 9:
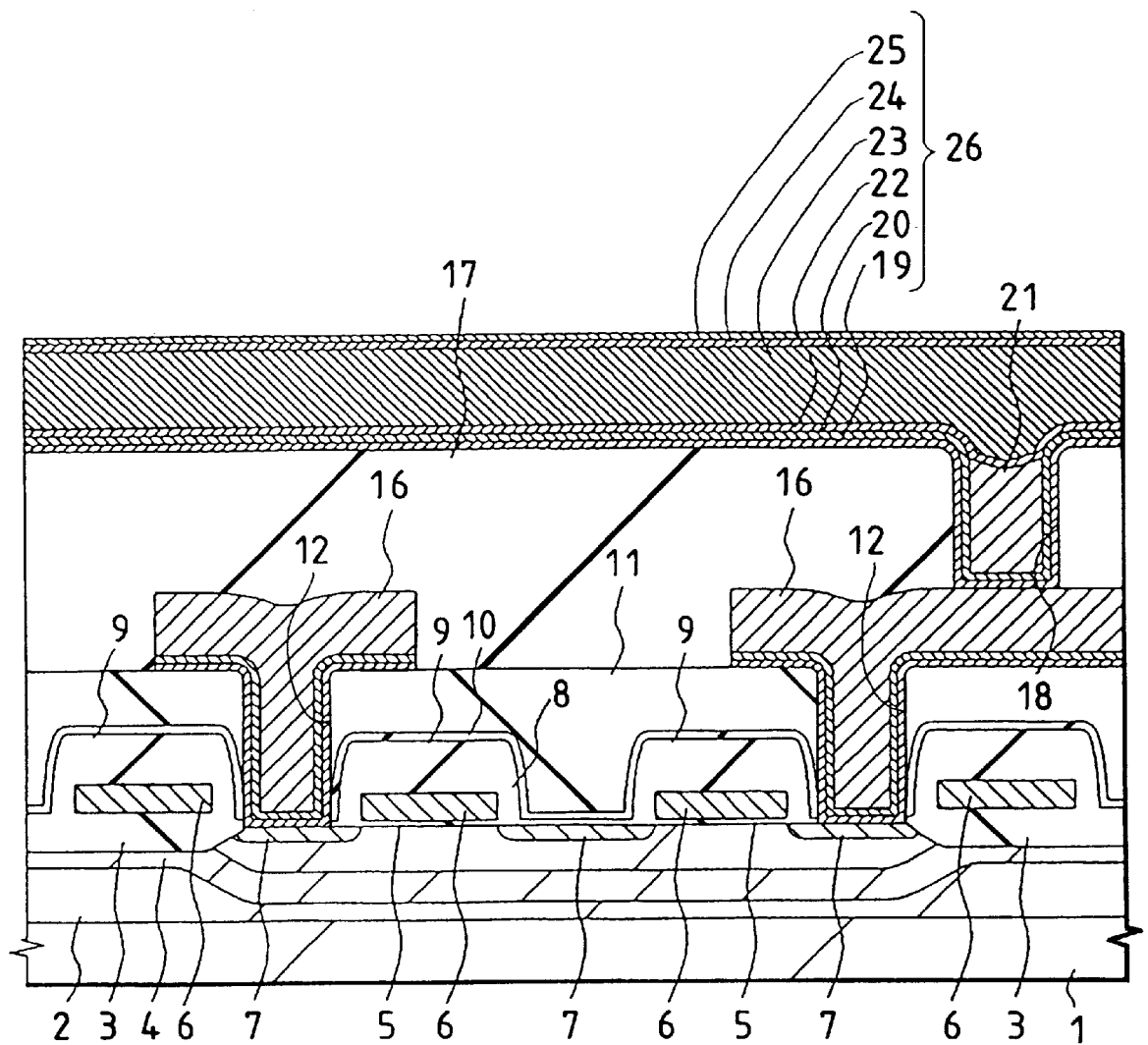

Next, as shown in FIG. 9, an upper film comprising a titanium (Ti) film 24 (10 nm in thickness) and a titanium nitride (TiN) film (60 nm in thickness) is deposited on the aluminium alloy (Al—Si—Cu) film 23 by a sputtering method, followed by patterning the titanium nitride (TiN) film 25, titanium (Ti) film 24, aluminium alloy (Al—Si—Cu) film 23, titanium nitride (TiN) film 20, titanium (Ti) film 19 by dry etching using a photoresist as a mask, thereby forming an aluminium (Al) interconnection 26 which is a second layer interconnection.

The titanium nitride (TiN) upper film 25 serves as an antireflection film which prevents halation occurring during the course of the patterning of the aluminium second interconnection 26. The titanium film 24 is provided in order to prevent formation of an aluminium nitride (Al$_3$N) film when the titanium nitride (TiN) film 25 is formed on the aluminium alloy (Al—Si—Cu) film 23.

Figure 10:
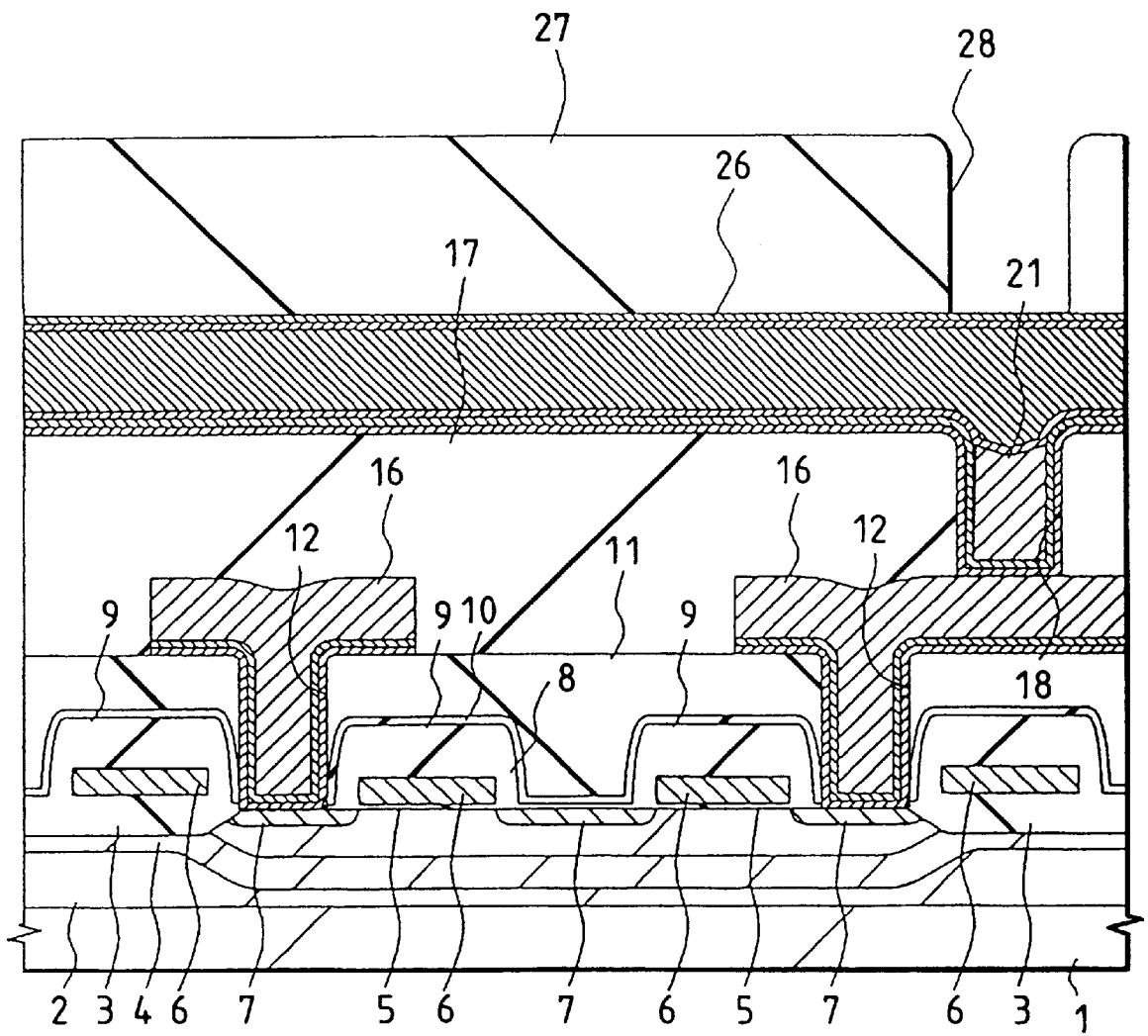

As shown in FIG. 10, a second interlayer insulating film 27 is deposited on the top of the aliminium (Al) interconnection 26. The interlayer insulating film 27 is constituted, for example, of a three-layered film consisting of a silicon oxide film deposited by a CVD method, a spin-on-glass film deposited by a spin coating method, and a silicon oxide film deposited by a CVD method.

Next, according to the dry etching using photoresist as a mask, a connection hole 28 is formed in the interlayer insulating film 27 at a position just above the connection hole 18 formed in the first interlayer insulating film 17. The aluminium (Al) interconnection 26 is flattened on the surface thereof (i. e. the bottom of the connection hole 28 ) by the re-flowing. Accordingly, when the connection hole 28 is located at a position just above the connection hole 18 and then formed with a Ti film 29, a TiN film 30 and a W film in this order, the conduction failure between the Al interconnection 26 and the upper Al interconnection layer can be appropriately prevented without formation of any insulating film in the connection hole 28.

Figure 11:
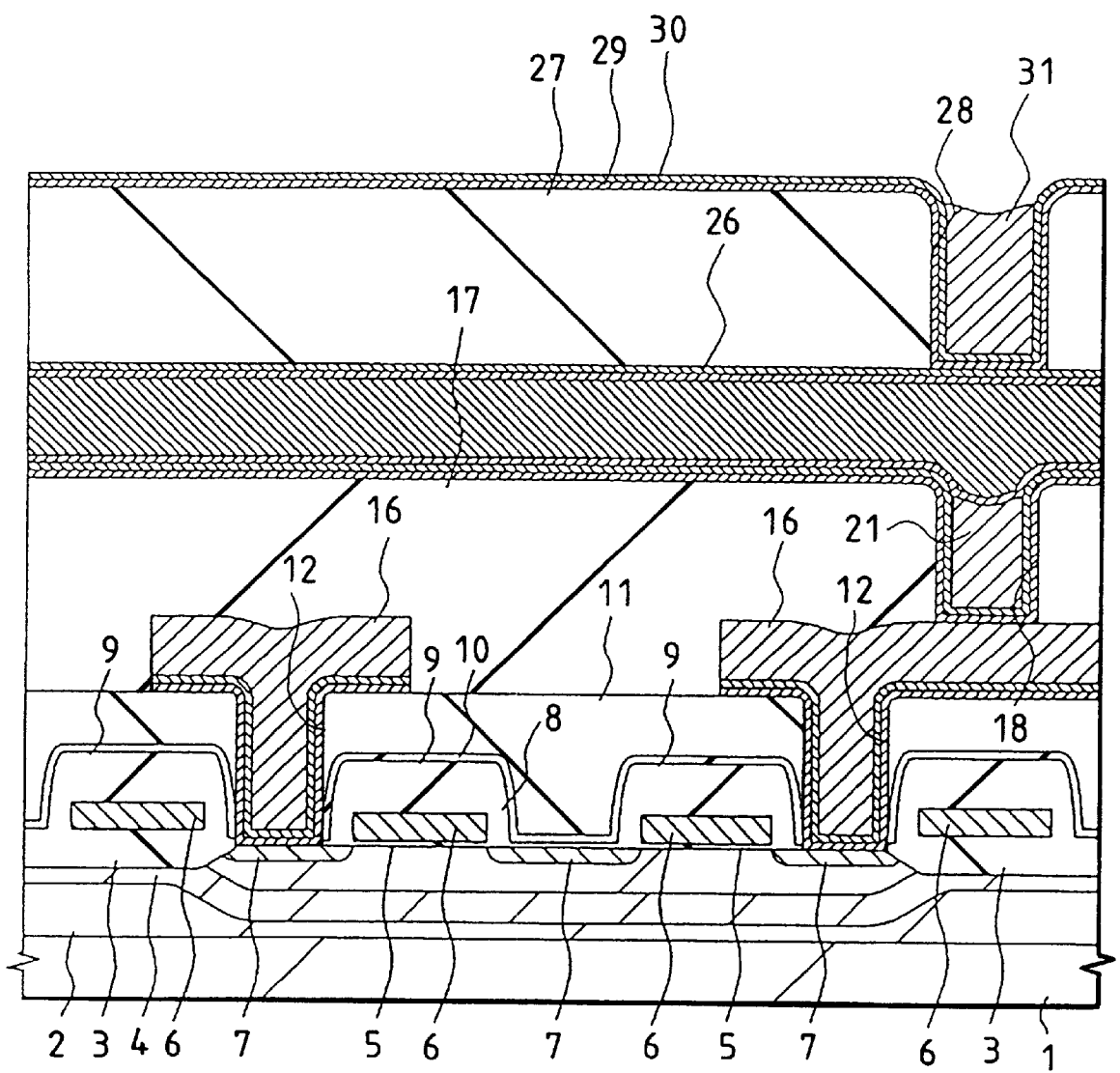

Then, as shown in FIG. 11, an underlying film comprising a titanium (Ti) film 29 (30 nm in thickness) and a titanium nitride (TiN) film 30 (100 nm in thickness) is deposited on the interlayer insulating film 27 including the inner surfaces of the connection hole 28. Thereafter, a tungsten (W) film 31 (500 nm in thickness) is deposited on the titanium nitride (TiN) film 30. Subsequently, the tungsten (W) film 31 on the insulating film 27 is etched back by use of a fluorine (F) plasma to remove the film 31 from the film 27 while leaving the tungsten (W) film 31 within the connection hole 28. Because part of F from the plasma undesirably remains on the surface of the titanium nitride (TiN) film 30 on the top of the interlayer insulating film 27 exposed by the etching-back, the titanium nitride (TiN) film 30 is subjected to sputter etching with argon (Ar) gas to an extent of approximately 15 nm, calculated as a thermally oxidized film (silicon oxide film), thereby removing the remaining fluorine (F).

The reason why the titanium nitride (TiN) film 30 is sputter-etched on the surface thereof is that when the surface of the titanium nitride (TiN) film 30 is contaminated with the fluorine (F), bonding at the interface with a film to be further deposited lowers. More particularly, we have found that when a wire is bonded to a bonding pad in a subsequent step, separation takes place at the interface beneath the bonding pad. It will be noted that the underlying titanium nitride (TiN) film 30 may be replaced by a zirconium nitride (ZrN) film.

Figure 12:
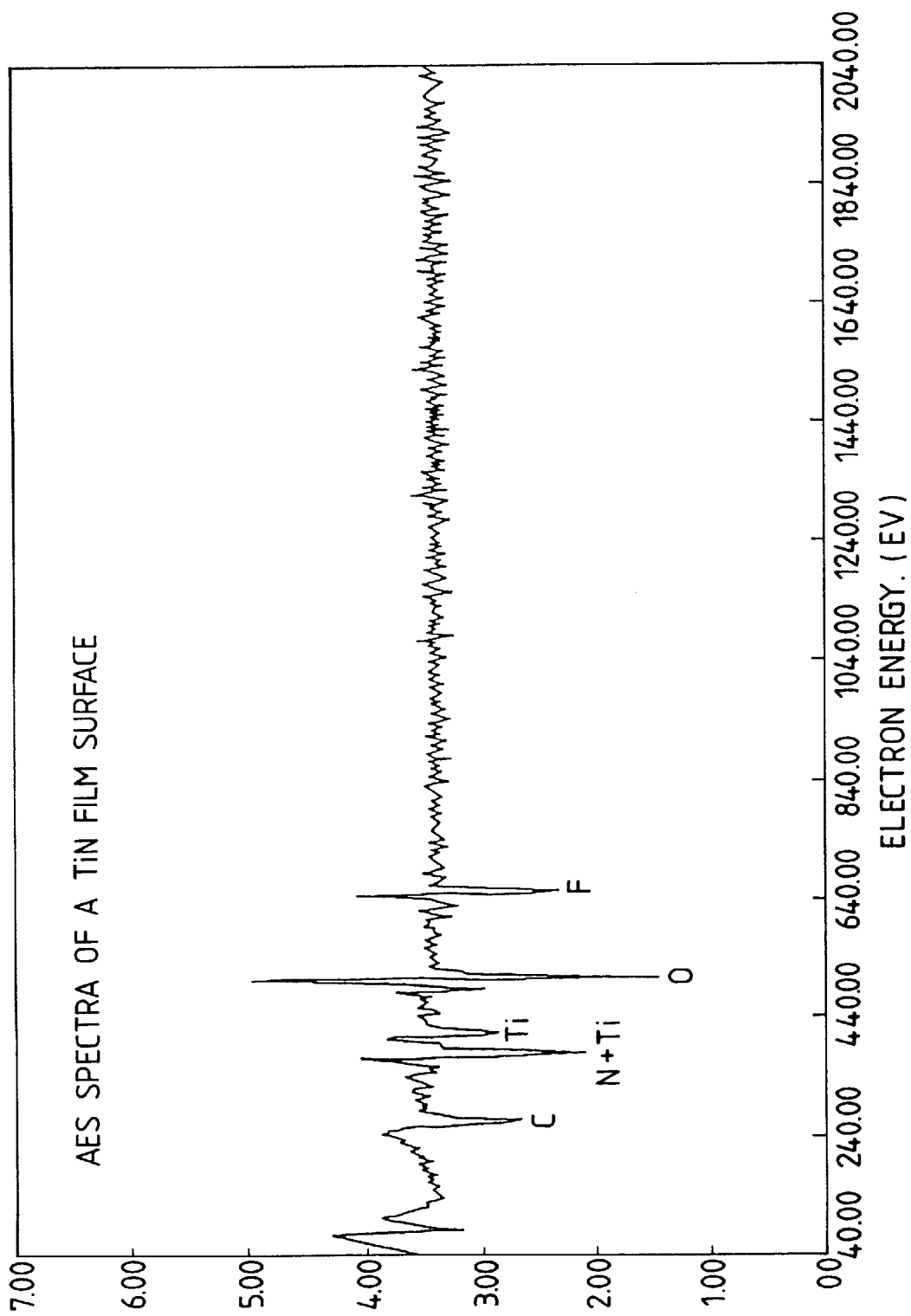
FIG. 12 is an AES spectrum chart of the surface of a TiN film prior to sputter etching.

FIG. 12 is a graph showing AES (Auger Electron Spectroscopy) spectra of the surface of the titanium nitride (TiN) film 30 prior to the sputter etching. From the spectral analysis, the content of fluorine (F) in or on the surfaces of the titanium nitride (TiN) film 30 is calculated as 12 atomic percent.

Figure 13:
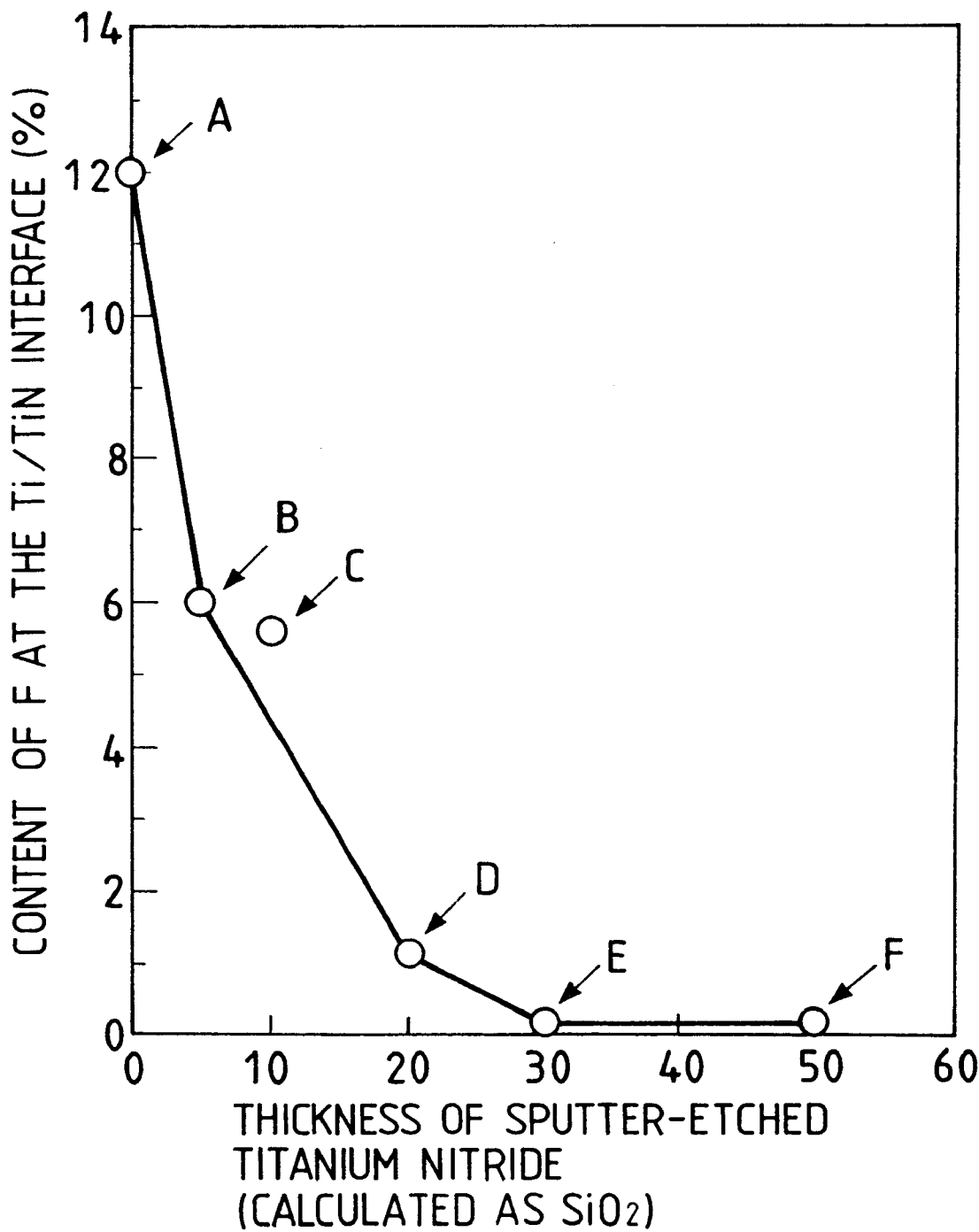
FIG. 13 is a graph showing the relation between the content of F at the interface of Ti/TiN films and the thickness of a sputter etched titanium nitride film.

FIG. 13 is a graph showing the relation between the content of fluorine (F) and the thickness of the sputter etched titanium nitride. The content of fluorine is determined by successively depositing, as will be described hereinafter, a titanium (Ti) film 32 and an aluminium alloy (Al—Si—Cu) film 33 on the titanium nitride (TiN) film 30 by a sputtering method and measuring the content of fluorine at the interface between the titanium nitride (TiN) film 30 and the titanium (Ti) film 32 by the SIMS analysis. For convenience's sake, the thickness of the sputter-etched titanium nitride (TiN) film 30 is indicated as a thickness of a sputter-etched silicon oxide film formed by thermal oxidation (wherein the sputter etching rate of the TiN film is 40% of the sputter etching rate of the silicon oxide film). From this, it has been calculated that the content of fluorine at the time when no sputter etching is conducted (A point in the figure) is 12 atomic percent, and the content of fluorine (F) at the time when the thickness of the sputter etched titanium nitride is 5 nm (B point in the figure) is 6 atomic percent.

Figure 14:
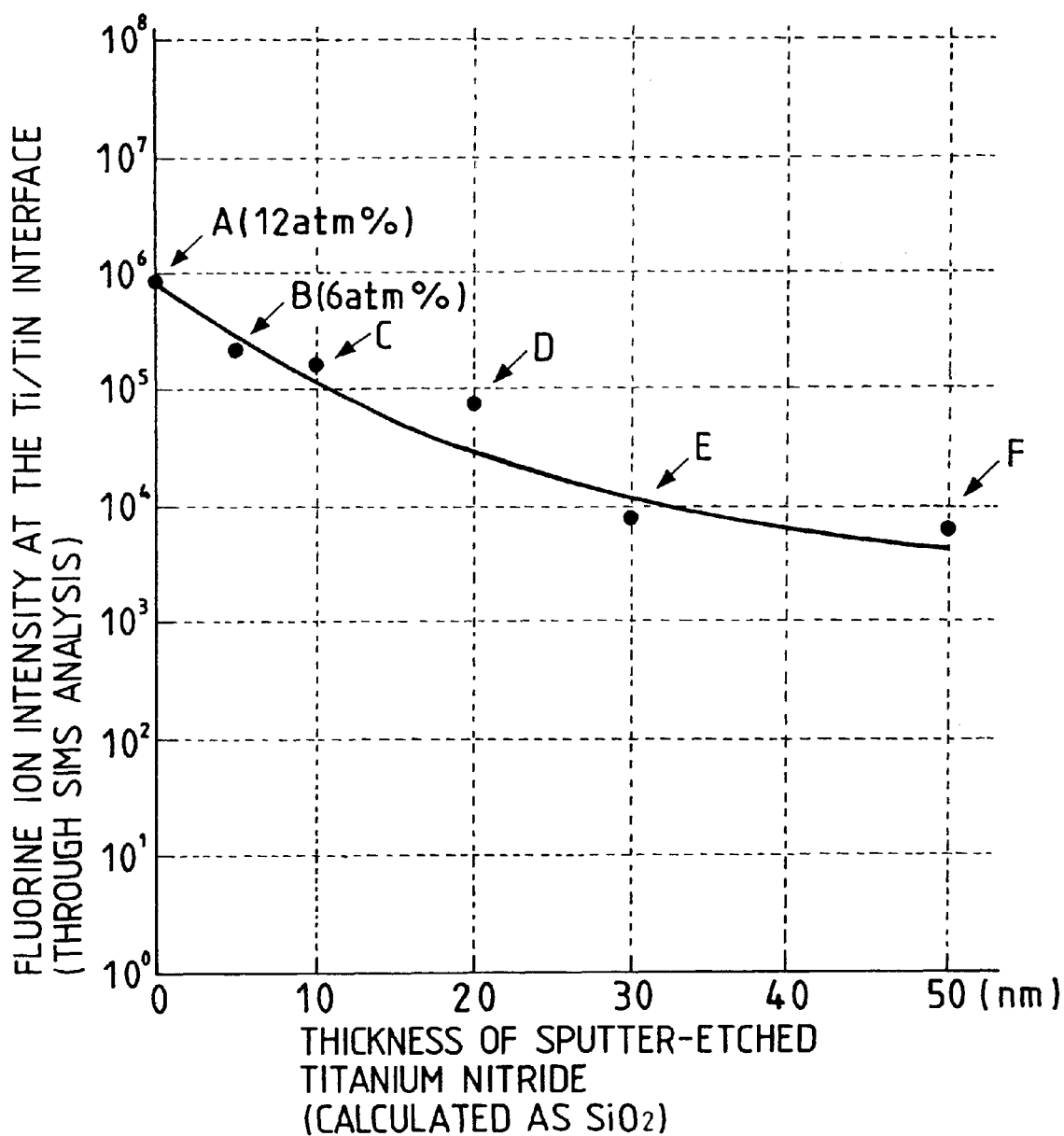
FIG. 14 is a graph showing the relation between the intensity of F ions at the interface of Ti/TiN films and the thickness of sputter-etched titanium nitride.

FIG. 14 is a graph showing the relation between the fluorine (F) ion intensity at the interface between the titanium nitride (TiN) film 30 and the titanium (Ti) film 32 and the thickness of sputter-etched titanium nitride film (calculated as a silicon oxide film). The relation is determined from the results of the AES spectra of FIG. 12 and the SIMS analysis of FIG. 13. The thickness of the sputter etched film and the bonding failure is shown in Table 1.

TABLE 1

Relation between the thickness of the sputter etched film and the bonding failure

| | thickness of sputter etched film (nm) | | | | | |
|---|---|---|---|---|---|---|
| | 0 | 5 | 10 | 20 | 30 | 50 |
| bonding failure | x | ○ | ○ | ○ | ○ | ○ |

*The thickness of sputter etched film is calculated as that of SiO$_2$.

As will be apparent from Table 1, when the titanium nitride (TiN) film 30 is not sputter etched on the surface thereof, separation in the bonding pad takes place. On the other hand, when the thickness of the sputter etched film is 5, 10, 20, 30 or 50 nm, no separation takes place. This reveals that the separation in the bonding pad can be prevented when the sputter etching is performed until the content of the fluorine (F) is 6 atomic percent or below (i.e. the thickness of the sputter etching is not smaller than 5 nm calculated as the silicon oxide film or not smaller than 2 nm for the titanium nitride film).

Since any bonding pad is formed at the second-layered interconnection (Al interconnection 26), the above problem does not arise. However, when the titanium nitride (TiN) film 20 is contaminated with fluorine (F) on the surface thereof, the bonding force at the interface with the titanium (Ti) film 22 being deposited thereon lowers. Accordingly, it is preferred to subject the surface of the titanium nitride (TiN) film 20 to sputter etching prior to the deposition of the titanium (Ti) film 22. The lowering of the bonding force by the action of the fluorine (F) does not take place only when the titanium (Ti) film is deposited on the titanium nitride (TiN) film. For instance, it will be highly possible that such a lowering occurs on direct deposition of the aluminium alloy (Al—Si—Cu) film on the titanium nitride (TiN) film 20. In the case, the titanium nitride (TiN) film should preferably be sputter etched prior to the deposition of the aluminium alloy (Al—Si—Cu) film.

Figure 15:
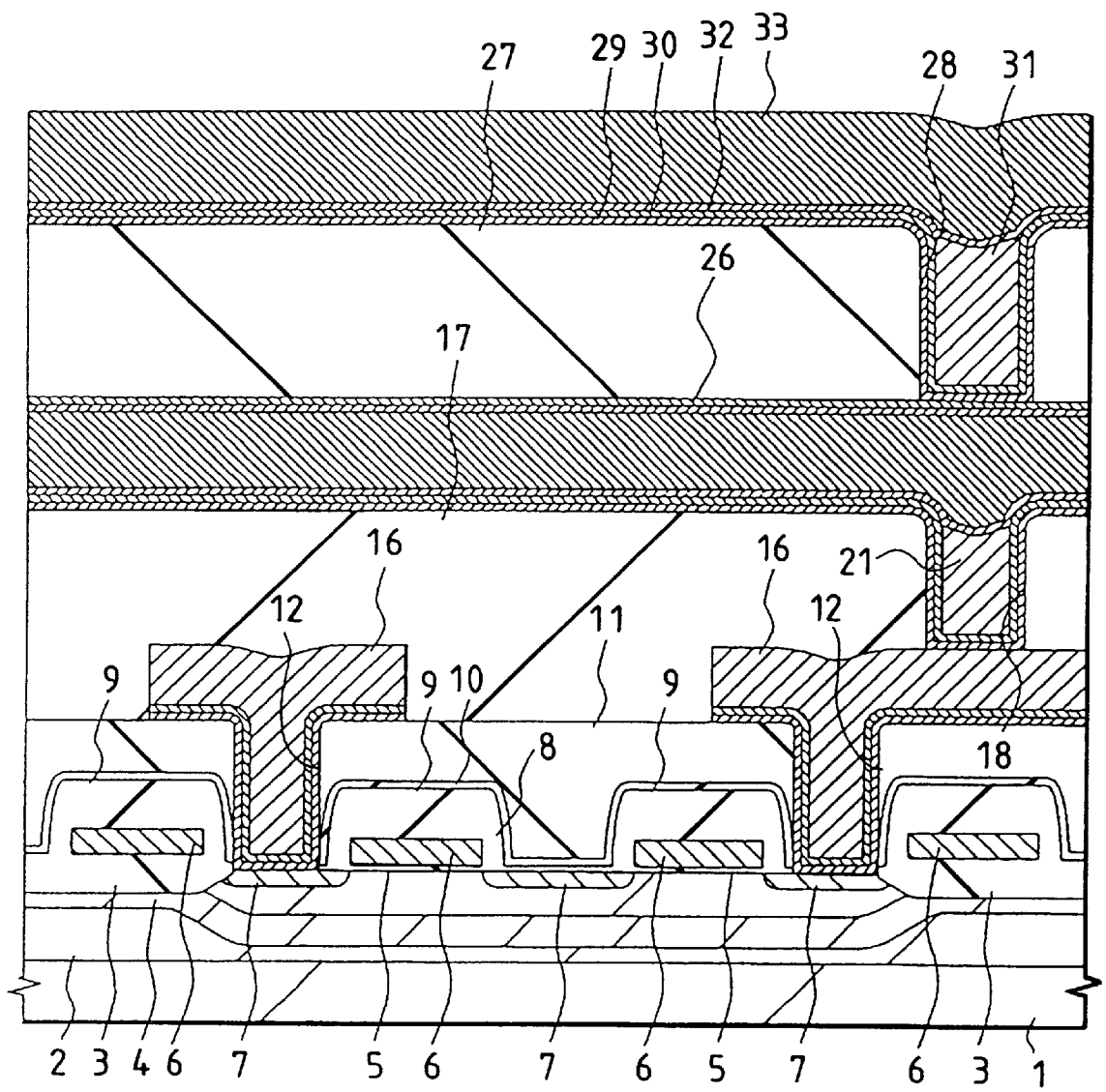

Next, as shown in FIG. 15, a titanium (Ti) film 32 (20 nm in thickness) and an aluminium alloy (Al—Si—Cu) film 33 (600 nm in thickness) are successively deposited on the titanium nitride (TiN) film 30 by a sputtering method. In this embodiment, the aluminium alloy (Al—Si—Cu) film 33 is deposited at two stages. More particularly, the semiconductor substrate 1 is kept at a temperature not higher than 150° C. at which first-stage deposition is carried out at a sputtering rate of approximately 1300 to 1700 nm/minute (300 nm in thickness). Subsequently, the semiconductor substrate 1 is kept at a temperature of 250 to 350° C., at which second-stage deposition is performed at a sputtering rate of approximately 400 to 800 nm (300 nm in thickness).

The sheet resistance and reflectivity of the aluminium alloy (Al—Si—Cu) film deposited under such conditions as set out hereinabove are shown in Table 2. Point A in Table 2 shows the case where the substrate temperature is maintained at 165° C., and the aluminium alloy (Al—Si—Cu) film 33 is deposited by one stage. With points B, C and D, the substrate temperature at the second stage is, respectively, maintained at 250° C., 300° C. and 350° C., and the respective aluminium alloy (Al—Si—Cu) films 33 are formed by two stages.

TABLE 2

Resistance and reflectivity under different Al sputtering conditions

| Film thickness of AlCuSi (nm) | Sputtering Rate (nm/minute) | | Temperature (° C.) | | Sheet Resistance (mΩ) | Reflectivity (%) (Wavelength: 365 nm) |
|---|---|---|---|---|---|---|
| | first stage | second stage | first stage | second stage | | |
| A 600 | 1500 | — | 165 | — | 51.7 | 97.5 |
| B 600 | 1500 | 600 | 165 | 250 | 50 | 97.9 |
| C 600 | 1500 | 600 | 165 | 300 | 49.1 | 96.4 |
| D 600 | 1500 | 600 | 165 | 350 | 49.6 | 83.3 |

The above results reveal that when the aluminium alloy (Al—Si—Cu) films 33 (B, C, D) are deposited by the two-stage sputtering process including a stage of a low temperature (165° C.) and a high sputtering rate (1500 nm/minute) and a stage of a high temperature (250 to 350° C.) and a low sputtering rate (600 nm/minute), they have sheet resistances and reflectivities almost the same as those of the film obtained by the one-stage sputtering process (A), but have reduced numbers of surface irregularities and precipitates of a reaction product in the film. Thus, the aluminium alloy (Al—Si—Cu) films 33 (B, C, D) exhibit a good coverage for all the cases.

Figure 16:
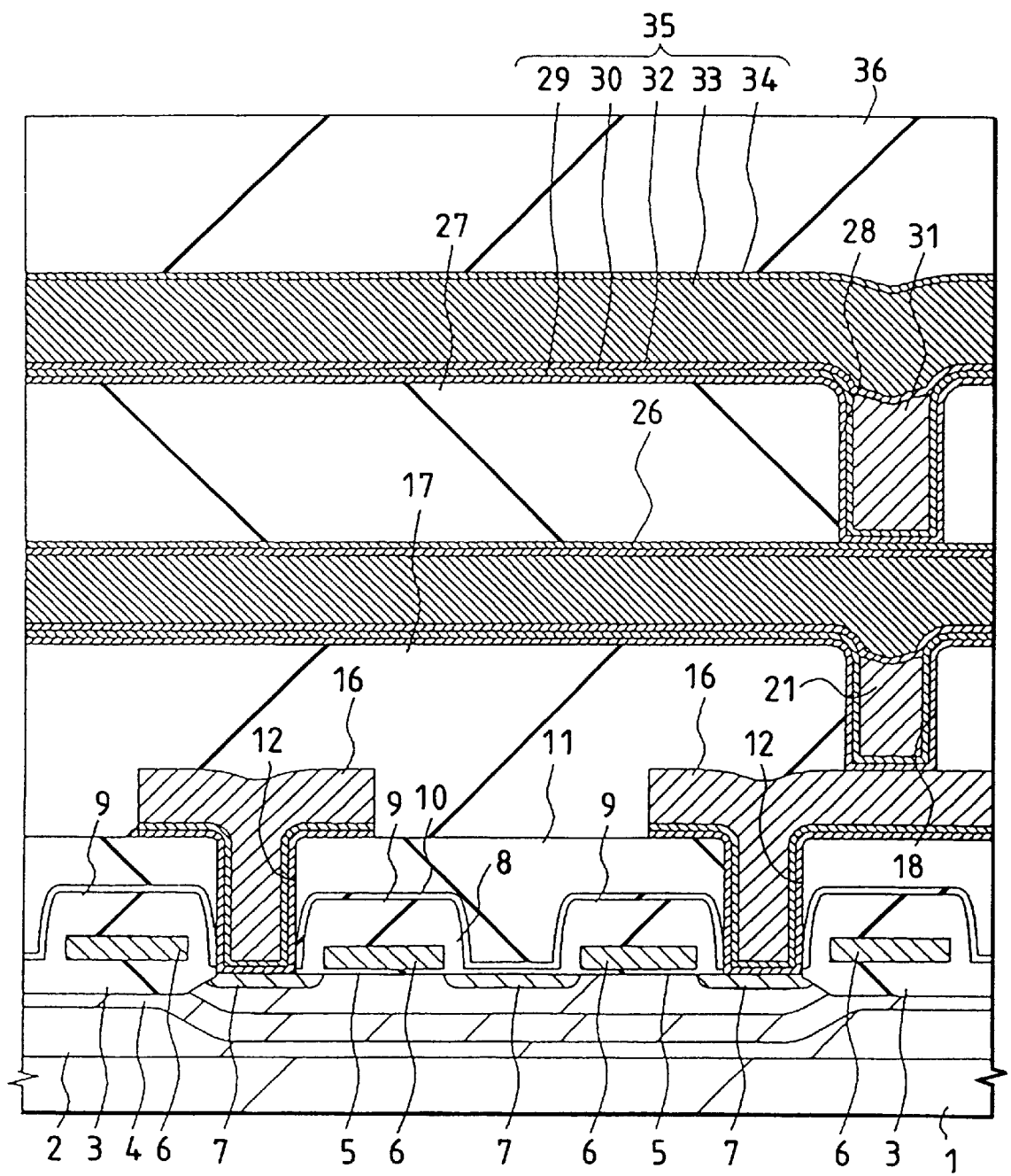

As shown in FIG. 16, an upper film is further deposited on the aluminium alloy (Al—Si—Cu) film 33. The upper film is constituted of a single-layered titanium nitride (TiN) film 34 (60 nm in film thickness). In other words, any titanium (Ti) film is not formed on the aluminium alloy (Al—Si—Cu) film 33. If a titanium (Ti) film is provided, the compound of titanium and the aluminium alloy is formed, thereby causing the bonding failure. As a mater of course, if a titanium (Ti) film is not provided, the compound of aluminium and the nitride is formed on the surface of the aluminium alloy film. However, this compound can be removed during the step of removing the titanium nitride at the time of making an opening for the bonding pad. After the deposition of the aluminium alloy (Al—Si—Cu) film 33, the re-flowing as set out hereinbefore may be carried out to cause the surface to be more flattened. Alternatively, after the deposition of the aluminium alloy (Al—Si—Cu) film 33, the semiconductor substrate may be removed to outside of the sputtering apparatus, and thus the aluminium alloy (Al—Si—Cu) film 33 may be exposed to the air to form an oxide film on the surface thereof. Thereafter, the upper film (TiN film 34) may be deposited thereon. In the case, the formation of the compound of aluminium and the nitride can be prevented.

The procedure of forming the aluminium alloy film by the two-stage process may also be applied to the formation of the aluminium alloy film 23 of the second-layered aluminium interconnection 26. In this case, the re-flowing step of the aluminium interconnection 26 may be omitted.

Then, the titanium nitride (TiN) film 34, aluminium alloy (Al—Si—Cu) film 33 titanium (Ti) film 32, titanium nitride (TiN) film 30 and titanium (Ti) film 29 are, respectively, patterned by dry etching using photoresist as a mask to form an uppermost aluminium (Al) interconnection 35, followed by further deposition of a passivation film 36 on the top of the aluminium (Al) interconnection 35. The passivation film 36 is constituted, for example, of a two-layered film consisting of a silicon oxide film deposited by a CVD method and a silicon nitride film deposited by a CVD method.

Figure 17:
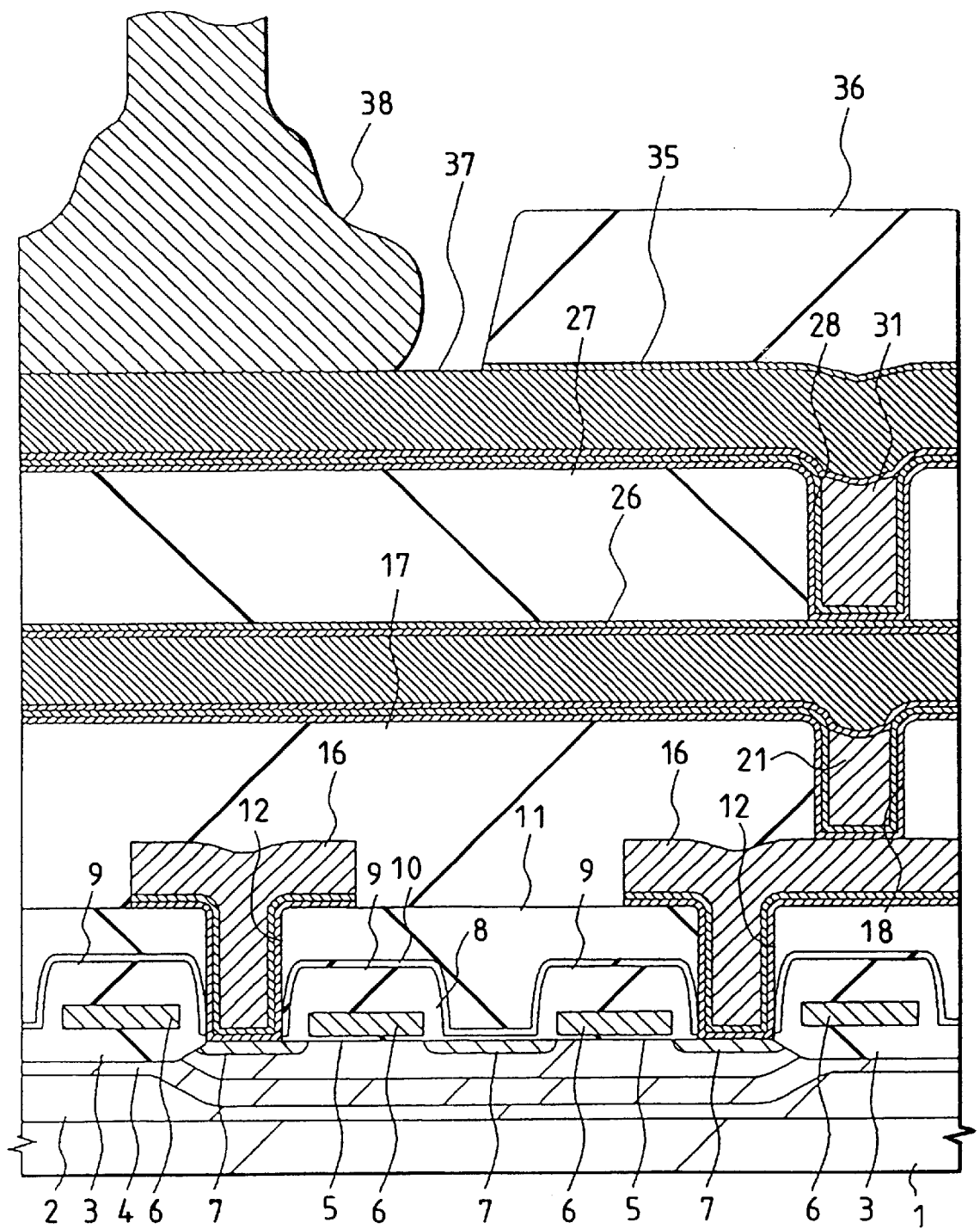

Next, as shown in FIG. 17, part of the passivation film 36 is made with a hole by dry etching using photoresist as a mask, thereby exposing part of the aluminium (Al) interconnection film 35 to form a bonding pad 37. The upper film on the surface of the bonding pad 37 (Al interconnection 35) is constituted of the single-layered titanium nitride (TiN) film 34 (provided that where the Al—Si—Cu film 33 is oxidized on the surface thereof, it is made of TiN film and oxide film). Accordingly, the bonding pad 37 is not deposited with the compound of aluminium (Al) and titanium (Ti) unlike the case where the upper film is constituted of a builtup film of the titanium nitride (TiN) film and the titanium (Ti) film.

Thus, according to this embodiment of the invention, when a gold (Au) wire 38 (i.e. a metallic wire) is bonded to the bonding pad 37, good bonding force between the bonding pad 37 and the wire 38 is ensured.

Moreover, according to the embodiment, the titanium nitride (TiN) film 30 which is a part of the uppermost aluminium (Al) interconnection is sputter etched on the surface thereof to remove the fluorine (F) therefrom, so that a satisfactory bonding force at the interface between the titanium nitride (TiN) film 30 and the titanium film (Ti) film 32 deposited thereon can be attained. Thus, the bonding pad 37 does not separate such as by impact of bonding of the wire 38 to the surface of the bonding pad 37.

In this embodiment, the upper film on the top of the uppermost interconnection is constituted of a titanium nitride (TiN) film. Accordingly, when part of the passivation film covering the uppermost interconnection is removed by etching to form the bonding pad, the reaction product of the aluminium alloy and titanium is prevented from precipitation at the interface between the Al film and the upper film.

Furthermore, the underlying film is sputter etched on the surface thereof with use of Ar gas to remove fluorine from the surface. This contributes to improving the bonding force at the interface between the underlying film and the underlying film or aluminium alloy film deposited on the first-mentioned underlying film.

The aluminium (Al) film is deposited by two stages including a first stage of deposing an aluminium (Al) film under low temperature and high sputtering rate conditions and a second stage of depositing another aluminium film under high temperature and low sputtering rate conditions. By this, the precipitation of a reaction product in the aluminium (Al) film can be prevented. Thus, the aluminium (Al) film obtained has a good coverage and a reduced degree of surface irregularities.

In addition, after deposition of the aluminium (Al) film by a sputtering method, the film is re-flown at such high temperatures that the aluminium(Al) interconnection just above the connection hole filled up with the tungsten (W) film can be flattened.

Having been described based on the embodiments, the invention should not be construed as limiting thereto. Many modifications and variations may be possible without departing from the scope of the invention.

For instance, applications to MOS-LSI having a three-layered interconnection have been set out in the embodiments, and the invention is applicable to LSI having a four-layered or multi-layered interconnection.

The effects attained by typical embodiments of the invention may be summarized below.

(1) According to the invention, the bonding force between a bonding pad and a metallic wire increases, thereby improving the reliability of connection between the bonding pad and the wire (2) The bonding force at the interface between the underlying films at the uppermost interconnection increases, thereby preventing separation of the bonding pad.

(3) An Al film is obtained as having a good coverage and a reduced degree of surface irregularities, thereby leading to improved processability of the Al interconnections.

(4) A stack-on-plug structure wherein an upper connection hole is made in an interlayer insulating film at a position just above a lower connection hole is realized, thereby ensuring a reduced chip area.

What is claimed is:

1. A semiconductor integrated circuit device which comprises:

(a) a semiconductor substrate;

(b) a first interconnection film formed over said semiconductor substrate;

(c) an insulating film formed on said first interconnection film and having a plurality of through-holes;

(d) a second interconnection film connected with said first interconnection film through the through-holes and formed on said insulating film; and (e) a bonding wire connected to the second interconnection film, wherein said first interconnection film is constituted of a first aluminum alloy film, a titanium film formed on said first aluminum alloy film, and a first titanium nitride film or a zirconium nitride film formed on said titanium film, and said second interconnection film is constituted of a second aluminum alloy film, a nitride film formed on said second aluminum alloy film and a second titanium nitride film formed on said nitride film, and said nitride film and said second titanium nitride film are removed from a region where said bonding wire is.

2. A semiconductor integrated circuit device according to claim 1, wherein said first titanium nitride film is formed on said titanium film.

3. A semiconductor integrated circuit device according to claim 2, wherein an amount of fluorine in the first titanium nitride film is at most 6 atomic percent.

4. A semiconductor integrated circuit device which comprises:

(a) a semiconductor substrate;

(b) a first interconnection film formed over said semiconductor substrate;

(c) an insulating film formed on said first interconnection film and having a plurality of through-holes;

(d) a second interconnection film connected with said first interconnection film through the through-holes and formed on said insulating film; and (e) a bonding wire connected to the second interconnection film, wherein said first interconnection film is constituted of a first aluminum alloy film, a titanium film formed on said first aluminum alloy film, and a first titanium nitride film or a zirconium nitride film formed on said titanium film, and said second interconnection film is constituted of a second aluminum alloy film, an oxide film formed on said second aluminum alloy film and a second titanium nitride film formed on said oxide film, and said oxide film and said second titanium nitride film are removed from a region where said bonding wire is.

5. A semiconductor integrated circuit device according to claim 4, wherein said first titanium nitride film is formed on said titanium film.

6. A semiconductor integrated circuit device according to claim 4, wherein said oxide film is a film formed by exposing the second aluminum alloy film to air.

* * * * *